United States Patent
Yahagi

(10) Patent No.: US 9,362,512 B2
(45) Date of Patent: Jun. 7, 2016

(54) ELECTRONIC DEVICE INSULATING LAYER MATERIAL CAPABLE OF FORMING AN INSULATING LAYER AT LOW TEMPERATURE

(71) Applicant: SUMITOMO CHEMICAL COMPANY, LIMITED, Chuo-ku, Tokyo (JP)

(72) Inventor: Isao Yahagi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/364,376

(22) PCT Filed: Dec. 12, 2012

(86) PCT No.: PCT/JP2012/082221
§ 371 (c)(1),
(2) Date: Jun. 11, 2014

(87) PCT Pub. No.: WO2013/094495
PCT Pub. Date: Jun. 27, 2013

(65) Prior Publication Data
US 2015/0236281 A1    Aug. 20, 2015

(30) Foreign Application Priority Data
Dec. 21, 2011    (JP) ................. 2011-280187

(51) Int. Cl.
     *H01L 51/40*      (2006.01)
     *H01L 51/05*      (2006.01)
     *H01B 3/44*      (2006.01)

(52) U.S. Cl.
CPC .............. *H01L 51/052* (2013.01); *H01B 3/442* (2013.01); *H01B 3/447* (2013.01); *H01B 3/448* (2013.01); *H01L 51/0545* (2013.01)

(58) Field of Classification Search
CPC . H01L 51/052; H01L 51/0545; H01L 29/786; H01L 21/4757; H01L 21/47; H01B 3/442; H01B 3/447; H01B 3/448; C09D 5/00
USPC .......................... 438/99, 694; 257/40, 57, 66; 106/287.18
See application file for complete search history.

(56) References Cited

U.S. PATENT DOCUMENTS 6,511,756 B1    1/2003    Obuchi et al.
2003/0211407 A1*   11/2003    Watanabe et al. ............... 430/17
(Continued)

FOREIGN PATENT DOCUMENTS

CN    101534967 A    9/2009
EP    1 026 189 A1    8/2000
(Continued)

OTHER PUBLICATIONS

Communication (PCT/IB/373) from the International Searching Authority issued Jun. 24, 2014 in a counterpart International Application No. PCT/JP2012/082221.
(Continued)

*Primary Examiner* — Caleb Henry
(74) *Attorney, Agent, or Firm* — Sughrue Mion, PLLC

(57) ABSTRACT

Insulating layer material comprising: polymer compound of a repeating unit containing a cyclic ether structure and a repeating unit of the formula:

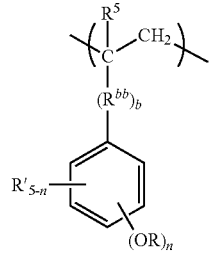

wherein $R^5$ represents a hydrogen atom or a methyl group; $R^{b\,b}$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms and optionally having a fluorine atom; the suffix b represents an integer of 0 or 1, and the suffix n represents an integer of from 1 to 5; when there are two or more Rs, they may be the same or different; and when there are two or more R's, they may be the same or different; and tungsten (V) alkoxide.

13 Claims, 1 Drawing Sheet

(56) References Cited

U.S. PATENT DOCUMENTS

| | | |
|---|---|---|
| 2009/0224234 A1 | 9/2009 | Kim et al. |
| 2009/0281238 A1 | 11/2009 | Hidaka et al. |
| 2011/0136992 A1* | 6/2011 | Yahagi ............ 525/474 |
| 2011/0193071 A1* | 8/2011 | Yahagi ............ 257/40 |
| 2012/0235148 A1* | 9/2012 | Yahagi ............ 257/59 |
| 2012/0273786 A1 | 11/2012 | Yahagi |
| 2012/0292626 A1* | 11/2012 | Yahagi ............ 257/59 |
| 2014/0070205 A1* | 3/2014 | Yahagi ............ 257/40 |
| 2015/0008418 A1* | 1/2015 | Yahagi ............ 257/40 |

FOREIGN PATENT DOCUMENTS

| | | |
|---|---|---|
| EP | 2 479 791 A1 | 7/2012 |
| JP | 4-132729 A | 5/1992 |
| JP | 11-124429 A | 5/1999 |
| JP | 2007-19121 A | 1/2007 |
| JP | 2007-305950 A | 11/2007 |
| JP | 2008-40187 A | 2/2008 |
| JP | 2009-224737 A | 10/2009 |
| JP | 2011-86926 A | 4/2011 |
| TW | 201124489 A1 | 7/2011 |
| WO | 2011/052618 A1 | 5/2011 |
| WO | 2011/062093 A1 | 5/2011 |

OTHER PUBLICATIONS

Communication (PCT/ISA/237) from the International Searching Authority issued Mar. 19, 2013 in a counterpart International Application No. PCT/JP2012/082221.

Communication (PCT/ISA/210) from the International Searching Authority issued Mar. 19, 2013 in a counterpart International Application No. PCT/JP2012/082221.

Kim, Se Hyun et al., "Hysteresis-free pentacene field-effect transistors and inverters containing poly (4-vinyl phenol-co-methyl methacrylate) Gate Dielectrics," American Institute of Physics, Applied Physics Letters, vol. 92, No. 183306, May 9, 2008, pp. 183306-1 to 183306-3.

Hwang, D.K. et al., "Comparative Studies on the Stability of Polymer Versus $SiO_2$ Gate Dielectrics for Pentacene Thin-Film Transistors," American Institute of Physics, Applied Physics Letters, vol. 89, No. 093507, Sep. 1, 2006, pp. 093507-1 to 093507-3.

Communication dated Jul. 29, 2015 from the European Patent Office in counterpart application No. 12858973.6.

Communication dated Jan. 20, 2016 from the State Intellectual Property Office of the P.R.C. in counterpart application No. 201280063670.7.

Communication dated Feb. 9, 2016, from the Japanese Patent Office in counterpart application No. 2011-280187.

* cited by examiner

ELECTRONIC DEVICE INSULATING LAYER MATERIAL CAPABLE OF FORMING AN INSULATING LAYER AT LOW TEMPERATURE

CROSS REFERENCE TO RELATED APPLICATIONS

This application is a National Stage of International Application No. PCT/JP2012/082221 filed Dec. 12, 2012, claiming priority based on Japanese Patent Application No. 2011-280187 filed Dec. 21, 2011, the contents of all of which are incorporated herein by reference in their entirety.

TECHNICAL FIELD

The present invention relates to an electronic device insulating layer material suitable for forming an insulating layer included in an electronic device.

BACKGROUND ART

In recent years, research of electronic devices such as organic thin film transistors and the like receive attention, and various materials to be used for the electronic devices are investigated. Among these, development of materials for forming an insulating layer included in the electronic device is actively carried out in order to suppress deterioration of the electronic device over time.

Since an organic thin film transistor which is one aspect of the electronic device can be produced at lower temperatures than inorganic semiconductors, a plastic substrate or film can be used as a substrate of the organic thin film transistor, and by using such a substrate, a device which is flexible, and is lightweight and is hardly breakable can be obtained. Moreover, since there are cases where a device can be produced by film formation using a method of applying or printing a solution containing an organic material, there are also cases where a large number of devices can be produced on a substrate of large area at low cost.

Furthermore, since there are a wide variety of materials which can be used for the investigation of transistors, a device with a wide range of varied characteristics can be produced by using materials varying in molecular structure in the investigation.

Further, organic semiconductor compounds to be used for an electric field effect type organic thin film transistor which is one aspect of organic thin film transistors are susceptible to environmental influences, such as humidity and oxygen, and therefore transistor characteristics are likely to be deteriorated over time due to humidity, oxygen, etc.

Therefore, in the device architecture of a bottom-gate type organic thin film transistor, which is one kind of electric field effect type organic thin film transistors, with an organic semiconductor compound exposed thereon, it is necessary to form an overcoat insulating layer covering the whole structure of the device so as to protect the organic semiconductor compound from being in contact with the open air. On the other hand, in the device architecture of a top gate type organic thin film transistor, which is another kind of electric field effect type organic thin film transistors, an organic semiconductor compound is coated and protected with a gate insulating layer. Thus, in organic thin film transistors, insulating layer materials are used in order to form an overcoat insulating layer and a gate insulating layer, both of which cover the organic semiconductor layer.

The organic thin film transistor insulating layer material is required to have electrical insulating properties and characteristics superior in electrical breakdown strength when having been formed into a thin film. Further, particularly in the bottom-gate type electric field effect type organic thin film transistor, an organic semiconductor layer is formed on the gate insulating layer. Therefore, the organic thin film transistor gate insulating layer material is required to have affinity with an organic semiconductor compound for forming an interface in close contact with the organic semiconductor layer and to have flatness of the surface on the organic semiconductor layer side of the film formed from the organic thin film transistor gate insulating layer material.

As a technology responding to such requirements, Patent Document 1 describes that an epoxy resin and a silane coupling agent are used in combination as an organic thin film transistor gate insulating layer material. In this technology, a composition containing an epoxy resin and a silane coupling agent is heated to 150° C., and thereby, a hydroxyl group produced at the time of a curing reaction of the epoxy resin is reacted with the silane coupling agent. The reason for this is that the above-mentioned hydroxyl group enhances the hygroscopic properties of the gate insulating layer material and impairs the stability of transistor performance.

Non-Patent Document 1 describes the use of a resin prepared by thermally cross-linking polyvinylphenol and a melamine compound at 175° C. for a gate insulating layer. In this technology, by cross-linking with the melamine compound, the hydroxyl groups contained in the polyvinylphenol are removed and the film strength is increased simultaneously. A pentacene TFT having this gate insulating layer has low hysteresis and exhibits durability to a gate bias stress.

Non-Patent Document 2 describes that polyvinylphenol and a copolymer prepared by copolymerizing vinylphenol with methyl methacrylate are heated at 150° C. and used for a gate insulating layer. In this technology, the polarity of the whole film is reduced by interactions between the hydroxyl group of vinylphenol and the carbonyl group of methyl methacrylate. A pentacene TFT having this gate insulating layer has low hysteresis and exhibits stable electric properties.

BACKGROUND ART DOCUMENTS

Patent Document

Patent Document 1: Japanese Patent Laid-open Publication No. 2007-305950

Non-Patent Documents

Non-Patent Document 1: Appl. Phys. Lett. 89, 093507 (2006)

Non-Patent Document 2: Appl. Phys. Lett. 92, 183306 (2008)

SUMMARY OF THE INVENTION

Problems to be Solved by the Invention

However, in a display in which a light-emitting device such as an organic electroluminescence device (organic EL device) or the like and an organic thin film transistor are formed on a plastic substrate, since the above-mentioned conventional electronic device insulating layer materials require high temperature for forming an insulating layer of the organic thin film transistor, they are not practical.

It is an object of the present invention to provide an electronic device insulating layer material capable of forming an insulating layer at low temperature.

Means for Solving the Problems

That is, the present invention pertains to an electronic device insulating layer material comprising:

a polymer compound (A) which contains a repeating unit containing a cyclic ether structure and a repeating unit represented by the formula (1):

[Chemical Formula 1]

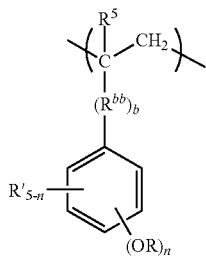

(1)

wherein $R^5$ represents a hydrogen atom or a methyl group; $R^{bb}$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms and optionally having a fluorine atom; the suffix b represents an integer of 0 or 1, and the suffix n represents an integer of from 1 to 5; when there are two or more Rs, they may be the same or different; and when there are two or more ifs, they may be the same or different; and tungsten (V) alkoxide (B).

In one embodiment, the repeating unit having a cyclic ether structure is at least one repeating unit selected from the group consisting of a repeating unit represented by the formula (2):

[Chemical Formula 2]

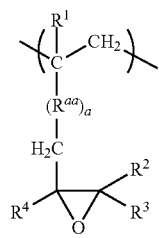

(2)

wherein $R^1$ represents a hydrogen atom or a methyl group; $R^2$, $R^3$ and $R^4$ each independently represent a hydrogen atom or a monovalent organic group having from 1 to 20 carbon atoms and optionally having a fluorine atom; $R^{aa}$ represents a linking moiety which links the main chain of the polymer compound with a side chain of the polymer compound, and optionally has a fluorine atom; and the suffix a represents an integer of 0 or 1, and a repeating unit represented by the formula (3):

[Chemical Formula 3]

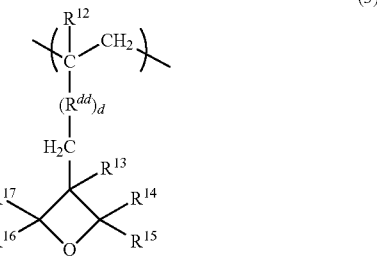

(3)

wherein $R^{12}$ represents a hydrogen atom or a methyl group; $R^{13}$, $R^{14}$, $R^{15}$, $R^{16}$ and $R^{17}$ each independently represent a hydrogen atom or a monovalent organic group having from 1 to 20 carbon atoms and optionally having a fluorine atom; $R^{dd}$ represents a linking moiety which links the main chain of the polymer compound with a side chain of the polymer compound, and optionally has a fluorine atom; and the suffix d represents an integer of 0 or 1.

In one embodiment, the polymer compound (A) is a polymer compound further containing a repeating unit containing the following first functional group:

first functional group: a functional group capable of affording, by the action of electromagnetic waves or heat, a second functional group capable of reacting with active hydrogen.

In one embodiment, the first functional group is at least one group selected from the group consisting of an isocyanato group blocked with a blocking agent and an isothiocyanato group blocked with a blocking agent.

In one embodiment, the isocyanato group blocked with a blocking agent and the isothiocyanato group blocked with a blocking agent are groups represented by the formula (5):

[Chemical Formula 4]

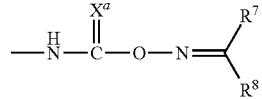

(5)

wherein $X^a$ represents an oxygen atom or a sulfur atom, and $R^7$ and $R^8$ each independently represent a hydrogen atom or a monovalent organic group having from 1 to 20 carbon atoms.

In one embodiment, the isocyanato group blocked with a blocking agent and the isothiocyanato group blocked with a blocking agent are groups represented by the formula (6):

[Chemical Formula 5]

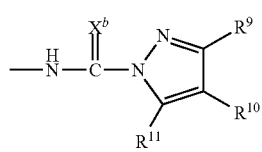

(6)

wherein $X^b$ represents an oxygen atom or a sulfur atom, and $R^9$, $R^{10}$ and $R^{11}$ each independently represent a hydrogen atom or a monovalent organic group having from 1 to 20 carbon atoms.

In one embodiment, the polymer compound (A) is a polymer compound further containing a repeating unit represented by the formula (4):

[Chemical Formula 6]

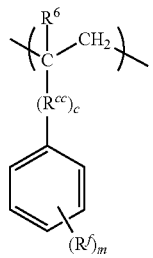

(4)

wherein $R^6$ represents a hydrogen atom or a methyl group; $R^f$ represents a fluorine atom or a monovalent organic group having from 1 to 20 carbon atoms and optionally having a fluorine atom; $R^{cc}$ represents a linking moiety which links the main chain of the polymer compound with a side chain of the polymer compound, and optionally has a fluorine atom; the suffix c represents an integer of 0 or 1, and the suffix m represents an integer of from 1 to 5; and when there are two or more $R^f$s, they may be the same or different, provided that at least one $R^f$ is a fluorine atom or a monovalent organic group having from 1 to 20 carbon atoms and having a fluorine atom.

In one embodiment, the electronic device insulating layer material is an organic thin film transistor insulating layer material.

Further, the present invention provides a method for forming an electronic device insulating layer comprising the steps of applying a solution containing the electronic device insulating layer material onto a substrate material to form an applied layer on the substrate material; and applying heat to the applied layer.

Further, the present invention provides an electronic device having an electronic device insulating layer formed by using the electronic device insulating layer material.

In one embodiment, the electronic device insulating layer is an organic thin film transistor gate insulating layer.

Further, the present invention provides a member for a display, the member comprising the electronic device.

Further, the present invention provides a display comprising the member for a display.

Effects of the Invention

The thin film organic transistor insulating layer can be formed at low temperature by using the electronic device insulating layer material of the present invention.

EMBODIMENTS FOR CARRYING OUT THE INVENTION

Figure 1:
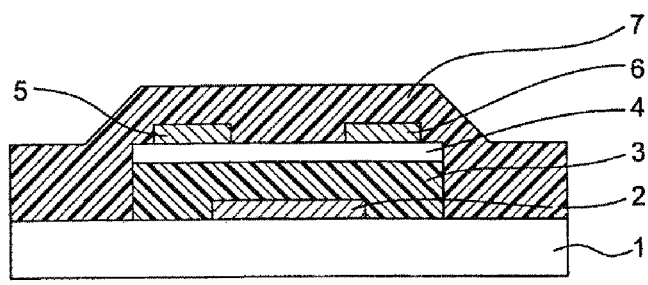
[FIG. 1] A schematic cross-sectional view showing the architecture of a bottom-gate/top-contact type organic thin film transistor which is one embodiment of an electronic device of the present invention.

In this specification, a "polymer compound" refers to any compound including a structure in which two or more identical structural units are repeated in a molecule, and this includes a so-called dimer. On the other hand, a "low-molecular compound" means any compound which does not have identical structural units repeatedly in a molecule. The "electronic device" means an active device which uses actions of electrons. The "electronic device insulating layer material" means a material used for forming an insulating layer included in an electronic device, and examples thereof include an organic thin film transistor insulating layer material, an organic electroluminescence device insulating layer material, an electronic paper insulating layer material, an RFID tag insulating layer material, and a liquid crystal display insulating layer material. The organic thin film transistor insulating layer material means a material used for forming an insulating layer included in an organic thin film transistor, such as a gate insulating layer, an overcoat insulating layer or the like. The organic electroluminescence device insulating layer material means a material used for forming an insulating layer for improving adhesiveness, which is included in an organic electroluminescence device, such as a primer layer, a planarizing layer, and an overcoat insulating layer. The electronic paper insulating layer material means a material used for forming an insulating layer for improving adhesiveness, which is included in electronic paper, such as a primer layer, a planarizing layer, and an overcoat insulating layer. The RFID tag insulating layer material means a material used for forming an insulating layer for improving adhesiveness, which is included in an RFID tag, such as a primer layer and an overcoat insulating layer. The liquid crystal display insulating layer material means a material used for forming an insulating layer included in a liquid crystal display.

The electronic device insulating layer material of the present invention comprises a polymer compound (A), and the polymer compound (A) contains a repeating unit having a cyclic ether structure and a repeating unit containing an organic group capable of being detached by an acid and represented by the formula (1).

The cyclic ether structure produces a cation in the presence of an acid, and a compound containing the cyclic ether structure is cationically polymerized. Further, in the presence of an acid, the cyclic ether structure reacts with the hydroxyl group produced by deprotection of the organic group capable of being detached by an acid in the repeating unit represented by the formula (1). Therefore, a cross-linking reaction of the polymer compound (A) occurs in the presence of an acid and thereby, a cross-linked structure can be formed. The tungsten (V) alkoxide (B) produces tungstic acid through hydrolysis thereof to promote the cross-linking reaction of the polymer compound (A) even at low temperature, and therefore a cross-linking density of an insulating layer formed by using the electronic device insulating layer material of the present invention is increased.

When the cross-linked structure is formed inside the insulating layer, the movement of the molecule in a compound included in the insulating layer is suppressed, and thus the polarization of the insulating layer is suppressed. If the polarization of the insulating layer is suppressed, for example, when the insulating layer is used as a gate insulating layer of the organic thin film transistor, hysteresis of the organic thin film transistor is lowered and operation accuracy of the organic thin film transistor is improved.

In the formula (1), $R^5$ represents a hydrogen atom or a methyl group. In one embodiment, $R^5$ is a methyl group.

In the formula (1), $R^{b\,b}$ represents a linking moiety which links the main chain with a side chain and optionally has a fluorine atom. The linking moiety may be a divalent group having a structure which does not exhibit reactivity under environmental conditions where the electronic device insulating layer material of the present invention is cross-linked. Examples of the linking moiety include a bond formed from a divalent organic group having from 1 to 20 carbon atoms, an ether bonding (—O—), a ketone bonding (—CO—), an ester bonding (—COO—, —OCO—), an amide bonding (—NHCO—, —CONH—), a urethane bonding (—NHCOO—, —OCONH—), and bondings in combination of these bondings. The suffix b represents an integer of 0 or 1. In one embodiment, the suffix b is 0.

The divalent organic group, represented by $R^{b\,b}$ and having from 1 to 20 carbon atoms, may be linear, branched or cyclic, and may be an aliphatic hydrocarbon group or an aromatic hydrocarbon group. Examples of the divalent organic group having from 1 to 20 carbon atoms include divalent linear aliphatic hydrocarbon groups having from 1 to 20 carbon atoms, divalent branched aliphatic hydrocarbon groups having from 3 to 20 carbon atoms, divalent cyclic hydrocarbon groups having from 3 to 20 carbon atoms and divalent aromatic hydrocarbon groups having from 6 to 20 carbon atoms and optionally having been substituted with an alkyl group or the like. Among these groups, divalent linear aliphatic hydrocarbon groups having from 1 to 6 carbon atoms, divalent branched aliphatic hydrocarbon groups having from 3 to 6 carbon atoms, divalent cyclic hydrocarbon groups having from 3 to 6 carbon atoms, and divalent aromatic hydrocarbon groups having from 6 to 20 carbon atoms and optionally having been substituted with an alkyl group or the like are preferred.

Examples of the divalent linear aliphatic hydrocarbon groups, the divalent branched aliphatic hydrocarbon groups and the divalent cyclic hydrocarbon groups include a methylene group, an ethylene group, a propylene group, a butylene group, a pentylene group, a hexylene group, an isopropylene group, an isobutylene group, a dimethylpropylene group, a cyclopropylene group, a cyclobutylene group, a cyclopentylene group and a cyclohexylene group.

Examples of the divalent aromatic hydrocarbon groups having from 6 to 20 carbon atoms and optionally having been substituted with an alkyl group or the like include a phenylene group, a naphthylene group, an anthrylene group, a dimethylphenylene group, a trimethylphenylene group, an ethylenephenylene group, a diethylenephenylene group, a triethylenephenylene group, a propylenephenylene group, a butylenephenylene group, a methylnaphthylene group, a dimethylnaphthylene group, a trimethylnaphthylene group, a vinylnaphthylene group, an ethenylnaphthylene group, a methylanthrylene group and an ethylanthrylene group.

In the formula (1), R' represents a hydrogen atom or a monovalent organic group having from 1 to 20 carbon atoms and optionally having a fluorine atom. The monovalent organic group having from 1 to 20 carbon atoms may be linear, branched or cyclic, and may be saturated or unsaturated.

Examples of the monovalent organic group, represented by R' and having from 1 to 20 carbon atoms, include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom contained in the linear hydrocarbon groups having from 1 to 20 carbon atoms, the branched hydrocarbon groups having from 3 to 20 carbon atoms and the cyclic hydrocarbon groups having from 3 to 20 carbon atoms has optionally been substituted with a fluorine atom.

Any hydrogen atom in the aromatic hydrocarbon groups having from 6 to 20 carbon atoms has optionally been substituted with an alkyl group, a fluorine atom, a chlorine atom, a bromine atom, an iodine atom or the like.

Specific examples of the monovalent organic group having from 1 to 20 carbon atoms include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

An alkyl group is preferred as the monovalent organic group having from 1 to 20 carbon atoms.

In the formula (1), R represents an organic group capable of being detached by an acid. This means that in the formula (1), when an acid acts on an OR group, an R group is detached to produce a phenolic hydroxyl group. The phenolic hydroxyl group can react with the cyclic ether structure to form a cross-linked structure. Also, the phenolic hydroxyl group may terminate cation polymerization of the polymer compound (A) or reduce the rate of the cation polymerization in some cases due to chain transfer, and the phenolic hydroxyl group can suppress the excessive progress of the cation polymerization of the polymer compound (A) in the presence of an acid.

Examples of the organic group capable of being detached by an acid include alkoxyalkyl groups having from 2 to 20 carbon atoms and optionally having a substituent, groups having from 3 to 20 carbon atoms and having a cyclic hydrocarbon structure such as an adamantyl group, tertiary alkyl groups, a tetrahydrofuranyl group, a tetrahydropyranyl group, and a 4-methoxytetrahydropyranyl group.

Examples of the substituent, which may be included in the alkoxyalkyl group having from 2 to 20 carbon atoms, include alkoxy groups having from 1 to 20 carbon atoms, alkyl groups having from 1 to 20 carbon atoms, aromatic hydrocarbon groups having from 6 to 20 carbon atoms and halogen atoms. Examples of the alkoxyalkyl groups having from 2 to 20 carbon atoms and optionally having a substituent include a methoxy methyl group, a methoxyethoxy methyl group, a 1-ethoxyethyl group, a 2-ethoxyethyl group, a bis(2-chloroethoxy)methyl group, a 1-methyl-1-methoxyethyl group and a 1-isopropoxyethyl group.

Examples of the groups having from 3 to 20 carbon atoms and having a cyclic hydrocarbon structure include a cyclopropyl methyl group, a cyclohexyl group and a 2-methyl-2-adamantyl group.

Examples of the tertiary alkyl groups include t-butyl groups.

The repeating unit having a cyclic ether structure is preferably a repeating unit represented by the formula (2) or a repeating unit represented by the formula (3).

In the formula (2), $R^1$ represents a hydrogen atom or a methyl group. In one embodiment, $R^1$ is a methyl group.

In the formula (2), $R^2$, $R^3$ and $R^4$ each independently represent a hydrogen atom or a monovalent organic group having from 1 to 20 carbon atoms and optionally having a fluorine atom. The definition and specific examples of the monovalent organic groups, represented by $R^2$, $R^3$ and $R^4$ and having from 1 to 20 carbon atoms, are the same as the definition and specific examples of the monovalent organic groups, represented by R' and having from 1 to 20 carbon atoms.

As the monovalent organic groups represented by $R^2$, $R^3$ and $R^4$ and having from 1 to 20 carbon atoms, alkyl groups are preferred.

In the formula (2), $R^{aa}$ represents a linking moiety which links the main chain with a side chain and optionally has a fluorine atom. The definition and specific examples of the linking moiety, represented by $R^{aa}$ and linking the main chain with the side chain, are the same as the definition and specific examples of the linking moiety represented by $R^{bb}$ and linking the main chain with the side chain. The suffix a represents an integer of 0 or 1. In one embodiment, the suffix a is 1.

In the formula (3), $R^{12}$ represents a hydrogen atom or a methyl group. In one embodiment, $R^{12}$ is a methyl group.

In the formula (3), $R^{13}$, $R^{14}$, $R^{15}$, $R^{16}$ and $R^{17}$ each independently represent a hydrogen atom or a monovalent organic group having from 1 to 20 carbon atoms and optionally having a fluorine atom. The definition and specific examples of the monovalent organic groups, represented by $R^{13}$, $R^{14}$, $R^{15}$, $R^{16}$ and $R^{17}$ and having from 1 to 20 carbon atoms, are the same as the definition and specific examples of the monovalent organic groups, represented by R' and having from 1 to 20 carbon atoms.

As the monovalent organic groups represented by $R^{13}$, $R^{14}$, $R^{15}$, $R^{16}$ and $R^{17}$ and having from 1 to 20 carbon atoms, alkyl groups are preferred.

In the formula (3), $R^{dd}$ represents a linking moiety which links the main chain with a side chain and optionally has a fluorine atom. The definition and specific examples of the linking moiety, represented by $R^{dd}$ and linking the main chain with the side chain, are the same as the definition and specific examples of the linking moiety represented by $R^{dd}$ and linking the main chain with the side chain. The suffix d represents an integer of 0 or 1. In one embodiment, the suffix d is 1.

One aspect of the polymer compound (A) of the present invention is a polymer compound containing a repeating unit represented by the formula (1), and a repeating unit represented by the formula (2) or a repeating unit represented by the formula (3), and further containing a repeating unit represented by the formula (4), and at least one repeating unit selected from the group consisting of repeating units containing repeating units each containing a first functional group, in which the first functional group is a functional group capable of affording, by the action of electromagnetic waves or heat, a second functional group capable of reacting with active hydrogen.

Herein, the active hydrogen refers to a hydrogen atom which bonds to an atom other than a carbon atom, such as an oxygen atom, a nitrogen atom or a sulfur atom.

In the formula (4), $R^6$ represents a hydrogen atom or a methyl group. In one embodiment, $R^6$ is a methyl group.

In the formula (4), $R^{cc}$ represents a linking moiety which links the main chain with a side chain and optionally has a fluorine atom. The definition and specific examples of the linking moiety, represented by $R^{ee}$ and linking the main chain with the side chain, are the same as the definition and specific examples of the linking moiety represented by $R^{bb}$ and linking the main chain with the side chain. The suffix c represents an integer of 0 or 1. In one embodiment, the suffix c is 0.

In the formula (4), $R^f$ represents a fluorine atom or a monovalent organic group having from 1 to 20 carbon atoms and optionally having a fluorine atom. In one embodiment, $R^f$ is a fluorine atom.

The suffix m represents an integer of from 1 to 5. In one embodiment, the suffix m is 5.

The monovalent organic group represented by $R^f$, having from 1 to 20 carbon atoms and optionally having a fluorine atom, may be linear, branched or cyclic, and may be saturated or unsaturated.

Examples of the monovalent organic group having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom in the aromatic hydrocarbon groups having from 6 to 20 carbon atoms has optionally been substituted with an alkyl group, a chlorine atom, a bromine atom, an iodine atom or the like.

When $R^f$ is a monovalent organic group having from 1 to 20 carbon atoms and not having a fluorine atom, specific examples of the monovalent organic group having from 1 to 20 carbon atoms and not having a fluorine atom include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

An alkyl group is preferred as the monovalent organic group having from 1 to 20 carbon atoms and not having a fluorine atom.

When $R^f$ is an organic group having from 1 to 20 carbon atoms and having a fluorine atom, examples of the monovalent organic group having from 1 to 20 carbon atoms and having a fluorine atom include a trifluoromethyl group, a 2,2,2-trifluoroethyl group, a 2,2,3,3,3-pentafluoropropyl group, a 2-(perfluorobutyl)ethyl group, a pentafluorophenyl group and a trifluoromethylphenyl group.

As the monovalent organic group represented by $R^f$, having from 1 to 20 carbon atoms and optionally having a fluorine atom, alkyl groups substituted with a fluorine atom are preferred.

In the formula (4), at least one $R^f$ is a fluorine atom or a monovalent organic group having from 1 to 20 carbon atoms and having a fluorine atom. Preferably, the suffix m is 5, and five $R^f$s are fluorine atoms, or monovalent organic groups having from 1 to 20 carbon atoms and having a fluorine atom.

By introducing fluorine into the electronic device insulating layer material, the insulating layer formed of the insulating layer material has low polarity and the polarization of the insulating layer is suppressed.

A fluorine atom is preferably substituted for a hydrogen atom of a side chain or a side group (a pendant group) of a polymer compound, rather than for a hydrogen atom of the main chain of the polymer compound. When a fluorine atom is substituted at the side chain or the side group, affinity for other organic materials such as an organic semiconductor compound does not deteriorate, and in the case of forming a layer including the organic materials, the organic materials well contact with an exposed surface of the insulating layer, and this facilitates formation of a layer.

Although the first functional group does not react with active hydrogen, when the first functional group is subjected to electromagnetic wave irradiation or subjected to the action of heat, the second functional group is produced and reacts with active hydrogen. That is, the first functional group is deprotected by the action of electromagnetic waves or heat and can afford the second functional group capable of reacting with active hydrogen. The second functional group reacts with an active hydrogen-containing group contained in the electronic device insulating layer material and is bound to the active hydrogen-containing group so that it can form a cross-linked structure within the insulating layer. Further, the amount of the active hydrogen contained in the insulating layer is reduced by the reaction of the active hydrogen-containing group with the second functional group to suppress the polarization of the insulating layer.

Examples of the active hydrogen-containing group contained in the electronic device insulating layer material include hydroxyl groups produced from the cyclic ether structure when a polymer compound containing the cyclic ether structure is polymerized in the presence of an acid; and hydroxyl groups produced when organic groups R is detached from the repeating unit represented by the formula (1) by the action of an acid.

The electronic device insulating layer material of the present invention may further contain at least one active hydrogen compound selected from the group consisting of an active hydrogen compound which is a low-molecular compound containing two or more active hydrogens and an active hydrogen compound which is a polymer compound containing two or more active hydrogens.

The second functional group is protected (blocked) and is present in the electronic device insulating layer material in the form of the first functional group before electromagnetic waves or heat is applied in the step of forming the electronic device insulating layer. As a result, storage stability of the electronic device insulating layer material is improved.

Preferred examples of the first functional group include an isocyanato group blocked with a blocking agent and an isothiocyanato group blocked with a blocking agent.

The above-mentioned isocyanato group blocked with a blocking agent can be produced by reacting a blocking agent having only one active hydrogen capable of reacting with an isocyanato group in a molecule with an isocyanato group. The above-mentioned isothiocyanato group blocked with a blocking agent can be produced by reacting a blocking agent having only one active hydrogen capable of reacting with an isothiocyanato group in a molecule with an isothiocyanato group.

As the blocking agent, one which dissociates at a temperature of 170° C. or lower even after reacting with an isocyanato group or an isothiocyanato group is preferred. Examples of the blocking agent include alcohol type compounds, phenol type compounds, active methylene type compounds, mercaptan type compounds, acid amide type compounds, acid imide type compounds, imidazole type compounds, urea type compounds, oxime type compounds, amine type compounds, imine type compounds, bisulfites, pyridine type compounds and pyrazole type compounds. These blocking agents may be used alone or may be used as a mixture of two or more of them. Preferred blocking agent includes oxime type compounds and pyrazole type compounds.

Specific examples of the blocking agents are shown below. Examples of the alcohol type compounds include methanol, ethanol, propyl alcohol, butanol, 2-ethylhexanol, methylcellosolve, butylcellosolve, methylcarbitol, benzyl alcohol and cyclohexanol. Examples of the phenol type compounds include phenol, cresol, ethylphenol, butylphenol, nonylphenol, dinonylphenol, styrenated phenol and hydroxybenzoic acid esters. Examples of the active methylene type compounds include dimethyl malonate, diethyl malonate, methyl acetoacetate, ethyl acetoacetate and acetylacetone. Examples of the mercaptan type compounds include butyl mercaptan and dodecylmercaptan. Examples of the acid amide type compounds include acetanilide, acetic acid amide, ∈-caprolactam, δ-valerolactam and γ-butyrolactam. Examples of the acid imide type compounds include succinimide and maleimide. Examples of the imidazole type compounds include imidazole and 2-methylimidazole. Examples of the urea type compounds include urea, thiourea and ethyleneurea. Examples of the oxime type compounds include formaldoxime, acetaldoxime, acetoxime, methylethylketoxime and cyclohexanone oxime. Examples of the amine type compounds include diphenylamine, aniline and carbazole. Examples of the imine type compounds include ethyleneimine and polyethyleneimine. Examples of the bisulfites include sodium bisulfite. Examples of the pyridine type compounds include 2-hydroxypyridine and 2-hydroxyquinoline. Examples of the pyrazole type compounds include 3,5-dimethylpyrazole and 3,5-diethylpyrazole.

As the isocyanato group blocked with a blocking agent and the isothiocyanato group blocked with a blocking agent, which may be respectively used in the present invention, a group represented by the formula (5) and a group represented by the formula (6) are preferred.

In the formula (5) and the formula (6), $X^a$ represents an oxygen atom or a sulfur atom, $X^b$ represents an oxygen atom or a sulfur atom, and $R^7$, $R^8$, $R^9$, $R^{10}$ and $R^{11}$ each independently represent a hydrogen atom or a monovalent organic group having from 1 to 20 carbon atoms.

The definition and specific examples of the monovalent organic groups, represented by $R^7$, $R^8$, $R^9$, $R^{10}$ and $R^{11}$ and having from 1 to 20 carbon atoms, are the same as the definition and specific examples of the monovalent organic groups, represented by R' and having from 1 to 20 carbon atoms.

As the monovalent organic groups represented by $R^7$, $R^8$, $R^9$, $R^{10}$ and $R^{11}$ and having from 1 to 20 carbon atoms, alkyl groups are preferred.

In one embodiment, $R^7$, $R^8$, $R^9$, $R^{10}$ and $R^{11}$ are hydrogen atoms.

Examples of the isocyanato group blocked with a blocking agent include an O-(methylideneamino)carboxyamino group, an O-(1-ethylideneamino)carboxyamino group, an O-(1-methylethylideneamino)carboxyamino group, an O-[1-methylpropylideneamino]carboxyamino group, an (N-3,5-dimethylpyrazolylcarbonyl)amino group, an (N-3-ethyl-5-methylpyrazolylcarbonyl)amino group, an (N-3,5-diethylpyrazolylcarbonyl)amino group, an (N-3-propyl-5- methylpyrazolylcarbonyl)amino group and an (N-3-ethyl-5-propylpyrazolylcarbonyl)amino group.

Examples of the isothiocyanato group blocked with a blocking agent include an O-(methylideneamino)thiocarboxyamino group, an O-(1-ethylideneamino)thiocarboxyamino group, an O-(1-methylethylideneamino)thiocarboxyamino group, an O-[1-methylpropylideneamino]thiocarboxyamino group, an (N-3,5-dimethylpyrazolylthiocarbonyl)amino group, an (N-3-ethyl-5-methylpyrazolylthiocarbonyl)amino group, an (N-3,5-diethylpyrazolylthiocarbonyl)amino group, an (N-3-propyl-5-methylpyrazolylthiocarbonyl)amino group and an (N-3-ethyl-5-propylpyrazolylthiocarbonyl)amino group.

An isocyanato group blocked with a blocking agent is preferred as the first functional group.

The polymer compound (A) can be produced by, for example, a method of copolymerizing, by using a photopolymerization initiator or a thermal polymerization initiator, a polymerizable monomer mixture containing a polymerizable monomer serving as a raw material of the repeating unit represented by the formula (1), a polymerizable monomer serving as a raw material of the repeating unit represented by the formula (2) or a polymerizable monomer serving as a raw material of the repeating unit represented by the formula (3), and a polymerizable monomer serving as a raw material of the repeating unit represented by the formula (4) or a polymerizable monomer containing the first functional group.

Examples of the polymerizable monomer serving as a raw material of the repeating unit represented by the formula (1) include 4-(methoxymethoxy)styrene, 4-(methoxyethoxymethoxy)styrene, 4-(1-ethoxyethoxyl)styrene, 4-(2-ethoxyethoxyl)styrene, 4-(tetrahydropyranyloxy)styrene, a 4-(cyclopropylmethoxy)styrene group and 4-(cyclohexyloxy)styrene.

Examples of the polymerizable monomer serving as a raw material of the repeating unit represented by the formula (2) include glycidyl acrylate, glycidyl methacrylate, 2-glycidyl ethyl acrylate and 2-glycidyl ethyl methacrylate.

Examples of the polymerizable monomer serving as a raw material of the repeating unit represented by the formula (3) include 3-acryloyloxymethyl-3-ethyl oxetane and 3-methacryloyloxymethyl-3-ethyl oxetane.

Examples of the polymerizable monomer serving as a raw material of the repeating unit represented by the formula (4) include 2-trifluoromethylstyrene, 3-trifluoromethylstyrene, 4-trifluoromethylstyrene, 2,3,4,5,6-pentafluorostyrene and 4-fluorostyrene.

Examples of the polymerizable monomer containing the first functional group include monomers having either the isocyanato group blocked with a blocking agent or the isothiocyanato group blocked with a blocking agent and an unsaturated bond. The monomers having either the isocyanato group blocked with a blocking agent or the isothiocyanato group blocked with a blocking agent, and an unsaturated bond can be produced by reacting a compound having an isocyanato group or an isothiocyanato group and an unsaturated bond with a blocking agent. A double bond is preferred as the unsaturated bond.

Examples of the compound, having a double bond and an isocyanato group, include 2-acryloyloxyethylisocyanate, 2-methacryloyloxyethylisocyanate and 2-(2'-methacryloyloxyethyl)oxyethylisocyanate. Examples of the compound having a double bond and an isothiocyanato group include 2-acryloyloxyethylisothiocyanate, 2-methacryloyloxyethylisothiocyanate and 2-(2'-methacryloyloxyethyl)oxyethylisothiocyanate.

The above-mentioned blocking agents can be suitably used for producing the polymerizable monomer containing the first functional group. In the reaction of producing the monomers having either the isocyanato group blocked with a blocking agent or the isothiocyanato group blocked with a blocking agent, and an unsaturated bond by reacting the compound having either an isocyanato group or an isothiocyanato group, and an unsaturated bond with a blocking agent, an organic solvent, a catalyst, etc. can be added as necessary.

Examples of the above-mentioned monomer having the isocyanato group blocked with a blocking agent and a double bond include 2-[O-[1'-methylpropylideneamino]carboxyamino]ethyl methacrylate and 2-[N-[1',3'-dimethylpyrazolyl]carbonylamino]ethyl methacrylate.

Examples of the above-mentioned monomer having the isothiocyanato group blocked with a blocking agent and a double bond include 2-[O-[1'-methylpropylideneamino]thiocarboxyamino]ethyl methacrylate and 2-[N-[1',3'-dimethylpyrazolyl]thiocarbonylamino]ethyl methacrylate.

Examples of the photopolymerization initiator include carbonyl compounds such as acetophenone, 2,2-dimethoxy-2-phenylacetophenone, 2,2-diethoxyacetophenone, 4-isopropyl-2-hydroxy-2-methylpropiophenone, 2-hydroxy-2-methylpropiophenone, 4,4'-bis(diethylamino)benzophenone, benzophenone, methyl(ortho-benzoyl)benzoate, 1-phenyl-1,2-propanedione-2-(O-ethoxycarbonyl)oxime, 1-phenyl-1,2-propanedione-2-(ortho-benzoyl)oxime, benzoin, benzoin methyl ether, benzoin ethyl ether, benzoin isopropyl ether, benzoin isobutyl ether, benzoin octyl ether, benzil, benzyl dimethyl ketal, benzyl diethyl ketal, and diacetyl; derivatives of anthraquinone or thioxanthene, such as methylanthraquinone, chloroanthraquinone, chlorothioxanthone, 2-methylthioxanthone, and 2-isopropylthioxanthone; and sulfur compounds, such as diphenyldisulfide and dithiocarbamate.

When light energy is used as energy to initiate copolymerization, the wavelength of light for irradiation of the polymerizable monomer is 360 nm or more, preferably from 360 to 450 nm.

The thermal polymerization initiator may be any compound that can serve as an initiator of radical polymerization, and examples thereof include azo type compounds, such as 2,2'-azobisisobutyronitrile, 2,2'-azobisisovaleronitrile, 2,2'-azobis(2,4-dimethylvaleronitrile), 4,4'-azobis(4-cyanovaleric acid), 1,1'-azobis(cyclohexanecarbonitrile), 2,2'-azobis(2-methylpropane), and 2,2'-azobis(2-methylpropionamidine)dihydrochloride; ketone peroxides, such as methyl ethyl ketone peroxide, methyl isobutyl ketone peroxide, cyclohexanone peroxide, and acetylacetone peroxide; diacyl peroxides, such as isobutyl peroxide, benzoyl peroxide, 2,4-dichlorobenzoyl peroxide, o-methylbenzoyl peroxide, lauroyl peroxide, and p-chlorobenzoyl peroxide; hydroperoxides, such as 2,4,4-trimethylpentyl-2-hydroperoxide, diisopropylbenzene hydroperoxide, cumene hydroperoxide, and tert-butyl hydroperoxide; dialkyl peroxides, such as dicumyl peroxide, tert-butylcumyl peroxide, di-tert-butyl peroxide, and tris(tert-butylperoxy)triazine; peroxyketals, such as 1,1-di-tert-butylperoxycyclohexane and 2,2-di(tert-butylperoxy)butane; alkyl peresters, such as tert-butyl peroxypivalate, tert-butyl peroxy-2-ethylhexanoate, tert-butyl peroxyisobutylate, di-tert-butyl peroxyhexahydroterephthalate, di-tert-butyl peroxyazelate, tert-butyl peroxy-3,5,5-trimethylhexanoate, tert-butyl peroxyacetate, tert-butyl peroxybenzoate, and di-tert-butyl peroxytrimethyladipate; and peroxycarbonates, such as diisopropyl peroxydicarbonate, di-sec-butyl peroxydicarbonate, and tert-butyl peroxyisopropylcarbonate.

The polymer compound (A) may also be produced by adding, in polymerization, other polymerizable monomers other than the polymerizable monomer serving as a raw material of the repeating unit represented by the formula (1), the polymerizable monomer serving as a raw material of the repeating unit represented by the formula (2), the polymerizable monomer serving as a raw material of the repeating unit represented by the formula (3), the polymerizable monomer serving as a raw material of the repeating unit represented by the formula (4) and the polymerizable monomer containing the first functional group.

Examples of the additional polymerizable monomers to be used include acrylates and derivatives thereof, methacrylates and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allyl esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group.

The kind of the additional polymerizable monomer to be used is appropriately selected according to the property required of an insulating layer. From the viewpoint of excellent solvent resistance or reduced hysteresis of an organic thin film transistor, a monomer which forms a hard film having a high molecular density in a film containing a compound derived from the monomer like styrene and styrene derivatives is selected. Further, from the viewpoint of adhesiveness to a surface adjacent to an insulating layer such as the surface of a gate electrode or a substrate or the like, a monomer, which imparts plasticity to the polymer compound (A) as with methacrylates and derivatives thereof, and acrylates and derivatives thereof, is selected.

The acrylates and derivatives thereof may be monofunctional acrylates, or may be multifunctional acrylates even though an amount to be used thereof is limited. Examples thereof include methyl acrylate, ethyl acrylate, n-propyl acrylate, isopropyl acrylate, n-butyl acrylate, isobutyl acrylate, sec-butyl acrylate, hexyl acrylate, octyl acrylate, 2-ethylhexyl acrylate, decyl acrylate, isobornyl acrylate, cyclohexyl acrylate, phenyl acrylate, benzyl acrylate, 2-hydroxyethyl acrylate, 2-hydroxypropyl acrylate, 3-hydroxypropyl acrylate, 2-hydroxybutyl acrylate, 2-hydroxyphenylethyl acrylate, ethylene glycol diacrylate, propylene glycol diacrylate, 1,4-butanediol diacrylate, diethylene glycol diacrylate, triethylene glycol diacrylate, trimethylolpropane diacrylate, trimethylolpropane triacrylate, pentaerythritol pentaacrylate, 2,2,2-trifluoroethyl acrylate, 2,2,3,3,3-pentafluoropropyl acrylate, 2-(perfluorobutyl)ethyl acrylate, 3-perfluorobutyl-2-hydroxypropyl acrylate, 2-(perfluorohexyl)ethyl acrylate, 3-perfluorohexyl-2-hydroxypropyl acrylate, 2-(perfluorooctyl)ethyl acrylate, 3-perfluorooctyl-2-hydroxypropyl acrylate, 2-(perfluorodecyl)ethyl acrylate, 2-(perfluoro-3-methylbutyl)ethyl acrylate, 3-(perfluoro-3-methylbutyl)-2-hydroxypropyl acrylate, 2-(perfluoro-5-methylhexyl)ethyl acrylate, 2-(perfluoro-3-methylbutyl)-2-hydroxypropyl acrylate, 3-(perfluoro-5-methylhexyl)-2-hydroxypropyl acrylate, 2-(perfluoro-7-methyloctyl)ethyl acrylate, 3-(perfluoro-7-methyloctyl)-2-hydroxypropyl acrylate, 1H,1H,3H-tetrafluoropropyl acrylate, 1H,1H,5H-octafluoropentyl acrylate, 1H,1H,7H-dodecafluoroheptyl acrylate, 1H,1H,9H-hexadecafluorononyl acrylate, 1H-1-(trifluoromethyl)trifluoroethyl acrylate, 1H,1H,3H-hexafluorobutyl acrylate, N, N-dimethylacrylamide, N,N-diethylacrylamide and N-acryloylmorpholine.

The methacrylates and derivatives thereof may be monofunctional methacrylates, or may be multifunctional methacrylates even though an amount to be used thereof is limited. Examples of the methacrylates and derivatives thereof include methyl methacrylate, ethyl methacrylate, n-propyl methacrylate, isopropyl methacrylate, n-butyl methacrylate, isobutyl methacrylate, sec-butyl methacrylate, hexyl methacrylate, octyl methacrylate, 2-ethylhexyl methacrylate, decyl methacrylate, isobornyl methacrylate, cyclohexyl methacrylate, phenyl methacrylate, benzyl methacrylate, 2-hydroxyethyl methacrylate, 2-hydroxypropyl methacrylate, 3-hydroxypropyl methacrylate, 2-hydroxybutyl methacrylate, 2-hydroxyphenylethyl methacrylate, ethylene glycol dimethacrylate, propylene glycol dimethacrylate, 1,4-butanediol dimethacrylate, diethylene glycol dimethacrylate, triethylene glycol dimethacrylate, trimethylolpropane dimethacrylate, trimethylolpropane trimethacrylate, pentaerythritol pentamethacrylate, 2,2,2-trifluoroethyl methacrylate, 2,2,3,3,3-pentafluoropropyl methacrylate, 2-(perfluorobutyl)ethyl methacrylate, 3-perfluorobutyl-2-hydroxypropyl methacrylate, 2-(perfluorohexyl)ethyl methacrylate, 3-perfluorohexyl-2-hydroxypropyl methacrylate, 2-(perfluorooctyl)ethyl methacrylate, 3-perfluorooctyl-2-hydroxypropyl methacrylate, 2-(perfluorodecyl)ethyl methacrylate, 2-(perfluoro-3-methylbutyl)ethyl methacrylate, 3-(perfluoro-3-methylbutyl)-2-hydroxypropyl methacrylate, 2-(perfluoro-5-methylhexyl)ethyl methacrylate, 2-(perfluoro-3-methylbutyl)-2-hydroxypropyl methacrylate, 3-(perfluoro-5-methylhexyl)-2-hydroxypropyl methacrylate, 2-(perfluoro-7-methyloctyl)ethyl methacrylate, 3-(perfluoro-7-methyloctyl)-2-hydroxypropyl methacrylate, 1H,1H,3H-tetrafluoropropyl methacrylate, 1H,1H,5H-octafluoropentyl methacrylate, 1H,11-1,7H-dodecafluoroheptyl methacrylate, 1H,1H,9H-hexadecafluorononyl methacrylate, 1H-1-(trifluoromethyl)trifluoroethyl methacrylate, 1H,1H,3H-hexafluorobutyl methacrylate, N,N-dimethylmethacrylamide, N,N-dimethylmethacrylamide and N-acryloylmorpholine.

Examples of styrene and derivatives thereof include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, o-hydroxystyrene, m-hydroxystyrene, p-hydroxystyrene, 2-vinylbiphenyl, 3-vinylbiphenyl, 4-vinylbiphenyl, 1-vinylnaphthalene, 2-vinylnaphthalene, 4-vinyl-p-terphenyl, 1-vinylanthracene, a-methylstyrene, o-isopropenyltoluene, m-isopropenyltoluene, p-isopropenyltoluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinylbiphenyl, diisopropylbenzene and 4-aminostyrene.

Examples of the vinyl esters of organic carboxylic acids and derivatives thereof include vinyl acetate, vinyl propionate, vinyl butyrate, vinyl benzoate and divinyl adipate.

Examples of the allyl esters of organic carboxylic acids and derivatives thereof include allyl acetate, allyl benzoate, diallyl adipate, diallyl terephthalate, diallyl isophthalate and diallyl phthalate.

Examples of the dialkyl esters of fumaric acid and derivatives thereof include dimethyl fumarate, diethyl fumarate, diisopropyl fumarate, di-sec-butyl fumarate, diisobutyl fumarate, di-n-butyl fumarate, di-2-ethylhexyl fumarate and dibenzyl fumarate.

Examples of the dialkyl esters of maleic acid and derivatives thereof include dimethyl maleate, diethyl maleate, diisopropyl maleate, di-sec-butyl maleate, diisobutyl maleate, di-n-butyl maleate, di-2-ethylhexyl maleate and dibenzyl maleate.

Examples of the dialkyl esters of itaconic acid and derivatives thereof include dimethyl itaconate, diethyl itaconate, diisopropyl itaconate, di-sec-butyl itaconate, di-isobutyl itaconate, di-n-butyl itaconate, di-2-ethylhexyl itaconate and dibenzyl itaconate.

Examples of the N-vinylamide derivatives of organic carboxylic acids include N-methyl-N-vinylacetamide.

Examples of the terminal unsaturated hydrocarbons and derivatives thereof include 1-butene, 1-pentene, 1-hexene, 1-octene, vinylcyclohexane, vinyl chloride and allyl alcohol.

Examples of the organic germanium derivatives containing an unsaturated hydrocarbon group include allyltrimethylgermanium, allyltriethylgermanium, allyltributylgermanium, trimethylvinylgermanium and triethylvinylgermanium.

From the viewpoint of improving characteristics of the organic thin film transistor insulating layer, alkyl acrylate, alkyl methacrylate, styrene, acrylonitrile, methacrylonitrile and allyltrimethylgermanium are preferred as the additional polymerizable monomer to be used.

For example, when nitriles are used as the additional polymerizable monomers to be used, a cyano group is introduced into the organic thin film transistor insulating layer, resulting in improvements of solvent resistance and toughness of the insulating layer. Further, in this case, dielectric constant of the insulating layer is also improved.

When the polymer compound (A) contains the repeating unit containing the first functional group, the molar amount to be charged of the polymerizable monomer containing the first functional group is preferably 5% by mol or more and 50% by mol or less, and more preferably 5% by mol or more and 40% by mol or less with respect to all the polymerizable monomers which are involved in polymerization. By adjusting the molar amount to be charged of the polymerizable monomer containing the first functional group within this range, a cross-linked structure is adequately formed inside the insulating layer, the content of a polar group is maintained at a low level, and thus the polarization of the insulating layer is suppressed.

The polymer compound (A) preferably has a weight average molecular weight of from 3000 to 1000000, and more preferably from 5000 to 500000 in terms of polystyrene. The polymer compound (A) may be linear, branched or cyclic.

Examples of the polymer compound (A) include poly(4-(2-ethoxyethoxyl)styrene-co-glycidyl methacrylate), poly(4-(2-ethoxyethoxyl)styrene-co-3-methacryloyloxymethyl-3-ethyl oxetane), poly(4-(methoxymethoxy)styrene-co-glycidyl methacrylate), poly(4-(methoxymethoxy)styrene-co-3-methacryloyloxymethyl-3-ethyl oxetane), poly(4-(methoxyethoxymethoxy)styrene-co-glycidyl methacrylate), poly(4-(methoxyethoxymethoxy)styrene-co-3-methacryloyloxymethyl-3-ethyl oxetane), poly(4-(tetrahydropyranyloxy)styrene-co-glycidyl methacrylate), poly(4-(tetrahydropyranyloxy)styrene-co-3-methacryloyloxymethyl-3-ethyl oxetane), poly(4-(cyclopropylmethoxy)styrene-co-glycidyl methacrylate), poly(4-(cyclopropylmethoxy)styrene-co-3-methacryloyloxymethyl-3-ethyl oxetane), poly(4-(cyclohexyloxy)styrene-co-glycidyl methacrylate), poly(4-(cyclohexyloxy)styrene-co-3-methacryloyloxymethyl-3-ethyl oxetane), poly(4-(2-ethoxyethoxyl)styrene-co-glycidyl methacrylate-co-[2-[O-(1'-methylpropylideneamino)carboxyamino]ethyl-methacrylate]), poly(4-(2-ethoxyethoxyl)styrene-co-3-methacryloyloxymethyl-3-ethyl oxetane-co-[2-[O-(1'-methylpropylideneamino)carboxyamino]ethyl-methacrylate]), poly(4-(methoxymethoxy)styrene-co-glycidyl methacrylate-co-(2-[O-(1'-methylpropylideneamino)carboxyamino]ethyl-methacrylate]), poly(4-(methoxymethoxy)styrene-co-3-methacryloyloxyxnethyl-3-ethyl oxetane-co-[2-[O-(1'-methylpropylideneamino)carboxyamino]ethyl-methacrylate]), poly(4-(methoxyethoxymethoxy)styrene-co-glycidyl methacrylate-co-[2-[O-(1'-methylpropylideneamino)carboxyamino]ethyl-methacrylate]), poly(4-(methoxyethoxymethoxy)styrene-co-3-methacryloyloxymethyl-3-ethyl oxetane-co-[2-[O-(1'-methylpropylideneamino)carboxyamino]ethyl-methacrylate]), poly(4-(tetrahydropyranyloxy)styrene-co-glycidyl methacrylate-co-[2-[O-(1'-methylpropylideneamino)carboxyamino]ethyl-methacrylate]), poly(4-(tetrahydropyranyloxy)styrene-co-3-methacryloyloxymethyl-3-ethyl oxetane-co-[2-[O-(1'-methylpropylideneamino)carboxyamino]ethyl-methacrylate]), poly(4-(cyclopropylmethoxy)styrene-co-glycidyl methacrylate-co-[2-[O-(1'-methylpropylideneamino)carboxyamino]ethyl-methacrylate]), poly(4-(cyclopropylmethoxy)styrene-co-3-methacryloyloxymethyl-3-ethyl oxetane-co-[2-[O-(1'-methylpropylideneamino)carboxyamino]ethyl-methacrylate]), poly(4-(cyclohexyloxy)styrene-co-glycidyl methacrylate-co-[2-[O-(1'-methylpropylideneamino)carboxyamino]ethyl-methacrylate]), poly(4-(cyclohexyloxy)styrene-co-3-methacryloyloxymethyl-3-ethyl oxetane-co-[2-[O-(1'-methylpropylideneamino)carboxyamino]ethyl-methacrylate]), poly(4-(2-ethoxyethoxyl)styrene-co-glycidyl methacrylate-co-[2-[1'-(3',5'-dimethylpyrazolyl)carbonylamino]ethyl-methacrylate]), poly(4-(2-ethoxyethoxyl)styrene-co-3-methacryloyloxymethyl-3-ethyl oxetane-co-[2-[1'-(3',5'-dimethylpyrazolyl)carbonylamino]ethyl-methacrylate]), poly(4-(methoxymethoxy)styrene-co-glycidyl methacrylate-co-[2-[1'-(3',5'-dimethylpyrazolyl)carbonylamino]ethyl-methacrylate]), poly(4-(methoxymethoxy)styrene-co-3-methacryloyloxymethyl-3-ethyl oxetane-co-[2-[1'-(3',5'-dimethylpyrazolyl)carbonylamino]ethyl-methacrylate]), poly(4-(methoxyethoxymethoxy)styrene-co-glycidyl methacrylate-co-[2-[1'-(3',5'-dimethylpyrazolyl)carbonylamino]ethyl-methacrylate]), poly(4-(methoxyethoxymethoxy)styrene-co-3-methacryloyloxymethyl-3-ethyl oxetane-co-[2-[1'-(3',5'-dimethylpyrazolyl)carbonylamino]ethyl-methacrylate]), poly(4-(tetrahydropyranyloxy)styrene-co-glycidyl methacrylate-co-[2-[1'-(3',5' dimethylpyrazolyl)carbonylamino]ethyl-methacrylate]), poly(4-(tetrahydropyranyloxy)styrene-co-3-methacryloyloxymethyl-3-ethyl oxetane-co-[2-[1'-(3',5'-dimethylpyrazolyl)carbonylamino]ethyl-methacrylate]), poly(4-(cyclopropylmethoxy)styrene-co-glycidyl methacrylate-co-[2-[1'-(3',5'-dimethylpyrazolyl)carbonylamino]ethyl-methacrylate]), poly(4-(cyclopropylmethoxy)styrene-co-3-methacryloyloxymethyl-3-ethyl oxetane-co-[2-[1'-(3',5'-dimethylpyrazolyl)carbonylamino]ethyl-methacrylate]), poly(4-(cyclohexyloxy)styrene-co-glycidyl methacrylate-co-[2-[1'-(3',5'-dimethylpyrazolyl)carbonylamino]ethyl-methacrylate]), poly(4-(cyclohexyloxy)styrene-co-3-methacryloyloxymethyl-3-ethyl oxetane-co-[2-[1'-(3',5'-dimethylpyrazolyl)carbonylamino]ethyl-methacrylate]), poly(4-(2-ethoxyethoxyl)styrene-co-glycidyl methacrylate-co-pentafluorostyrene), poly(4-(2-ethoxyethoxy) styrene-co-3-methacryloyloxymethyl-3-ethyl oxetane-co-pentafluorostyrene), poly(4-(methoxymethoxy)styrene-co-glycidyl methacrylate-co-pentafluorostyrene), poly(4-(methoxymethoxy)styrene-co-3-methacryloyloxymethyl-3-ethyl oxetane-co-pentafluorostyrene), poly(4-(methoxyethoxymethoxy)styrene-co-glycidyl methacrylate-co-pentafluorostyrene), poly(4-(methoxyethoxymethoxy)styrene-co-3-methacryloyloxymethyl-3-ethyloxetane-co-pentafluorostyrene), poly(4-(tetrahydropyranyloxy)styrene-co-glycidyl methacrylate-co-pentafluorostyrene), poly(4-(tetrahydropyranyloxy)styrene-co-3-methacryloyloxymethyl-3-ethyl oxetane-co-pentafluorostyrene), poly(4-(cyclopropylmethyloxy)styrene-co-glycidyl methacrylate-co-pentafluorostyrene), poly(4-(cyclopropylmethoxy)styrene-co-3-methacryloyloxymethyl-3-ethyl oxetane-co-pentafluorostyrene), poly(4-(cyclohexyloxy)styrene-co-glycidyl methacrylate-co-pentafluorostyrene), poly(4-(cyclohexyloxy)styrene-co-3-methacryloyloxymethyl-3-ethyl oxetane-co-pentafluorostyrene), poly(4-(2-ethoxyethoxyl)styrene-co-glycidyl methacrylate-co-[2-[O-(1'-methylpropylideneamino)carboxyamino]ethyl-methacrylate]-co-acrylonitrile), poly(4-(2-ethoxyethoxyl)styrene-co-3-methacryloyloxymethyl-3-ethyl oxetane-co-[2-[O-(1'-methyipropylideneamino)carboxyamino]ethyl-methacrylate]-co-acrylonitrile), poly(4-(methoxymethoxy)styrene-co-glycidyl methacrylate-co-[2-[O-(1'-methylpropylideneamino)carboxyamino]ethyl-methacrylate]-co-acrylonitrile), poly(4-(methoxymethoxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(methoxyethoxymethoxy)styrene-co-glycidyl methacrylate-co-[2-[O-(1'-methylpropylideneamino)carboxyamino]ethyl-methacrylate]-co-acrylonitrile), poly(4-(methoxyethoxymethoxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(tetrahydropyranyloxy)styrene-co-glycidyl methacrylate-co-[2-[O-(1'-methylpropylidene amino)carboxyamino]ethyl-methacrylate]-co-acrylonitrile), poly(4-(tetrahydropyranyloxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(cyclopropylmethoxy)styrene-co-glycidyl methacrylate-co-[2-[O-(1'-methylpropylideneamino)carboxyamino]ethyl-methacrylate]-co-acrylonitrile), poly(4-(cyclopropylmethoxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(cyclohexyloxy)styrene-co-glycidyl methacrylate-co-[2-[O-(1'-methylpropylideneamino)carboxyamino]ethyl-methacrylate]-co-acrylonitrile) and poly(4-(cyclohexyloxy)styrene-co-3-methacryloyloxymethyl-3-ethyl oxetane-co-[2-[O-(1'-methylpropylideneamino)carboxyamino]ethyl-methacrylate]-co-acrylonitrile).

Examples of the tungsten (V) alkoxide (B) contained in the electronic device insulating layer material of the present invention include tungsten (V) methoxide, tungsten (V) ethoxide, tungsten (V) isopropoxide and tungsten (V) butoxide.

The content of the tungsten (V) alkoxide (B) in the electronic device insulating layer material of the present invention is preferably from 0.1 to 30% by weight, more preferably from 1 to 25% by weight, and further preferably from 5 to 20% by weight based on the weight of the polymer compound (A). When the amount of the tungsten (V) alkoxide (B) added is less than 0.1% by weight based on the weight of the polymer compound (A), the curing reaction may fail to proceed, and when the amount is more than 30% by weight, the storage stability of the electronic device insulating layer material may be deteriorated.

<Electronic Device Insulating Layer Material>

The electronic device insulating layer material of the present invention may contain a solvent for mixing a material or adjusting viscosity, a cross-linking agent to be used for cross-linking the polymer compound (A), an additive to be used in combination with the cross-linking agent, a stabilizer for the tungsten (V) alkoxide, etc. Examples of the solvent include ether solvents, such as tetrahydrofuran and diethyl ether, aliphatic hydrocarbon solvents, such as hexane, alicyclic hydrocarbon solvents, such as cyclohexane, unsaturated hydrocarbon solvents, such as pentene, aromatic hydrocarbon solvents, such as xylene, ketone solvents, such as acetone, acetate solvents, such as butyl acetate, alcohol solvents, such as isopropyl alcohol, halogen solvents, such as chloroform, and mixed solvents thereof. Examples of the additives include a catalyst for promoting a cross-linking reaction, a sensitizing agent, a leveling agent and a viscosity modifier. Examples of the stabilizer include acetylacetone.

The electronic device insulating layer material of the present invention is preferably an organic thin film transistor insulating layer material used for forming an insulating layer included in an organic thin film transistor. The organic thin film transistor insulating layer material is preferably used for forming an overcoat layer or a gate insulating layer among the insulating layers of an organic thin film transistor. The organic thin film transistor insulating layer material is preferably an organic thin film transistor overcoat layer material or an organic thin film transistor gate insulating layer material, and more preferably an organic thin film transistor gate insulating layer material.

<Formation of Insulating Layer>

The formation of the insulating layer of the electronic device is performed by adding a solvent to an electronic device insulating layer material to prepare an insulating layer application solution, applying the insulating layer application solution onto a substrate material, and drying the application solution as necessary to cure. Herein, the "substrate material" refers to a constituent member of an electronic device, on which an insulating layer is disposed. The organic solvent to be used in the insulating layer application solution is not particularly limited as long as it dissolves the electronic device insulating layer material, and it is preferably an organic solvent having a boiling point of from 100° C. to 200° C. under ambient pressure. Examples of the organic solvent include 2-heptanone (boiling point 151° C.) and propylene glycol monomethyl ether acetate (boiling point 146° C.). A leveling agent, a surfactant, a curing catalyst, etc. can be added to the insulating layer application solution as necessary.

The insulating layer application solution can be applied onto a substrate material by a publicly known method, such as spin coating, die coating, screen printing, and inkjet. The application layer to be formed is dried as necessary. The drying referred to herein means removal of the solvent contained in the applied resin composition. The drying may be performed at ordinary temperature, or may be performed by heating. When the drying is performed by heating, the heating temperature is 120° C. or lower, preferably from 60° C. to 110° C.

The dried application layer is then cured. Curing means that the electronic device insulating layer material is cross-linked. The cross-linking in this case means that an organic group capable of being detached by an acid in the repeating unit represented by the formula (1) is detached by tungstic acid produced through hydrolysis of the tungsten (V) alkoxide to produce a phenolic hydroxyl group, and the phenolic hydroxyl group reacts with the cyclic ether in the polymer compound (A), and/or that a ring of the cyclic ether in the polymer compound (A) is opened by the tungstic acid, and the polymer compound (A) is polymerized to form a polymer.

Then, in order that the electronic device insulating layer material is cross-linked, it is necessary that tungstic acid which initiates a cross-linking reaction exists in the electronic device insulating layer material. Thus, the tungsten (V) alkoxide contained in the electronic device insulating layer material is hydrolyzed in advance to produce tungstic acid.

The tungsten (V) alkoxide is easily hydrolyzed by contact with water. Therefore, the hydrolysis of the tungsten (V) alkoxide contained in the electronic device insulating layer material can be performed by adding water to the electronic device insulating layer material. In order to make the electronic device insulating layer material contain water, the electronic device insulating layer material may be made to absorb moisture, or water may be added to the electronic device insulating layer material.

An example of the operation of adding water to the electronic device insulating layer material is to dry the above-mentioned insulating layer application solution in an atmosphere where water exists, for example, in the atmospheric air. In this case, the drying may be performed at ordinary temperature, or may be performed, for example, by heating to the above-mentioned temperature.

In addition to this, in order to cross-link the electronic device insulating layer material, it is necessary that the organic group capable of being detached by an acid in the repeating unit represented by the formula (1) is detached by the action of the tungstic acid produced through hydrolysis of the tungsten (V) alkoxide, and/or that a ring of the cyclic ether in the polymer compound (A) is opened by the action of the tungstic acid.

An example of an operation for heating the electronic device insulating layer material containing water is to heat the above-mentioned insulating application layer which has been dried in the atmospheric air. The heating temperature of the insulating application layer is usually from 80° C. to 250° C., preferably from 100° C. to 150° C. The heating time of the insulating application layer is usually from 5 to 120 minutes, preferably from 10 to 60 minutes. When the heating temperature is too low or when the heating time is too short, cross-linking of the polymer compound in the insulating layer may be insufficient. When the heating temperature is too high or when the heating time is too long, the insulating layer may be damaged.

<Organic Thin Film Transistor>

FIG. 1 is a schematic cross-sectional view showing the structure of a bottom-gate/top-contact type organic thin film transistor which is one embodiment of the electronic device of the present invention. This organic thin film transistor includes a substrate 1, a gate electrode 2 formed on the substrate 1, a gate insulating layer 3 formed on the gate electrode 2, an organic semiconductor layer 4 formed on the gate insulating layer 3, a source electrode 5 and a drain electrode 6 formed on the organic semiconductor layer 4 with a channel portion sandwiched therebetween, and an overcoat 7 covering the whole body of the device.

The bottom-gate/top-contact type organic thin film transistor can be produced by, for example, forming a gate electrode on a substrate, forming a gate insulating layer on the gate electrode, forming an organic semiconductor layer on the gate insulating layer, forming a source electrode and a drain electrode on the organic semiconductor layer, and forming an overcoat. The organic thin film transistor insulating layer material of the present invention is suitably used for forming a gate insulating layer as an organic thin film transistor gate insulating layer material. Further, it can also be used for forming an overcoat layer as an organic thin film transistor overcoat layer material.

Figure 2:
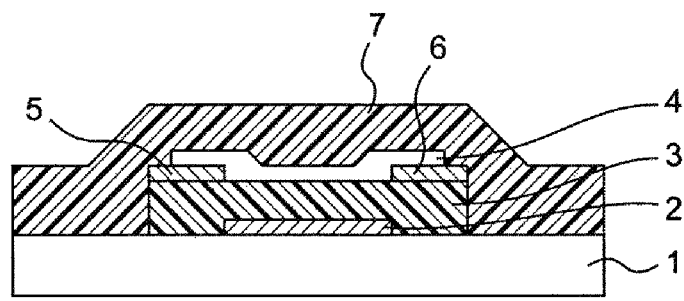
[FIG. 2] A schematic cross-sectional view showing the architecture of a bottom-gate/bottom-contact type organic thin film transistor which is another embodiment of an electronic device of the present invention.

FIG. 2 is a schematic cross-sectional view showing the structure of a bottom-gate/bottom-contact type organic thin film transistor which is one embodiment of the electronic device of the present invention. This organic thin film transistor includes a substrate 1, a gate electrode 2 formed on the substrate 1, a gate insulating layer 3 formed on the gate electrode 2, a source electrode 5 and a drain electrode 6 formed on the gate insulating layer 3 with a channel portion sandwiched therebetween, an organic semiconductor layer 4 formed on the source electrode 5 and the drain electrode 6, and an overcoat 7 covering the whole body of the device.

The bottom-gate/bottom-contact type organic thin film transistor can be produced by, for example, forming a gate electrode on a substrate, forming a gate insulating layer on the gate electrode, forming a source electrode and a drain electrode on the gate insulating layer, forming an organic semiconductor layer on the source electrode and the drain electrode, and forming an overcoat. The organic thin film transistor insulating layer material of the present invention is suitably used for forming a gate insulating layer as an organic thin film transistor gate insulating layer material. Further, it can also be used for forming an overcoat layer as an organic thin film transistor overcoat layer material.

The substrate 1, the gate electrode 2, the source electrode 5, the drain electrode 6 and the organic semiconductor layer 4 may be constituted using materials and methods which are conventionally used. A plate or a film of resin or plastics, a glass plate, a silicon plate or the like is used for the material of the substrate. The electrodes are formed by a publicly known method, such as a vacuum deposition method, a sputtering method, a printing method or an inkjet method, using chromium, gold, silver, aluminum, molybdenum or the like as their materials.

π-Conjugated polymers are used as an organic semiconductor compound for forming the organic semiconductor layer 4 and, for example, polypyrroles, polythiophenes, polyanilines, polyallylamines, fluorenes, polycarbazoles, polyindoles, and poly(p-phenylenevinylene)s can be used. Moreover, low-molecular substances soluble in organic solvents, for examples, derivatives of polycyclic aromatics such as pentacene, phthalocyanine derivatives, perylene derivatives, tetrathiafulvalene derivatives, tetracyanoquinodimethane derivatives, fullerenes, and carbon nanotubes can be used. Specific examples thereof include a condensate of 2,1,3-benzothiadiazole-4,7-di(ethylene boronate) with 2,6-dibromo-(4,4-bis-hexadecanyl-4H-cyclopenta[2,1-b:3,4-b']-dithiophene, and a condensate of 9,9-di-n-octylfluorene-2,7-di(ethylene boronate) with 5,5'-dibromo-2,2'-bithiophene.

The formation of the organic semiconductor layer is performed, for example, by adding, if necessary, a solvent or the like to an organic semiconductor compound to prepare an organic semiconductor application solution, applying the organic semiconductor application solution onto a gate insulating layer, and drying the organic semiconductor application solution. In the present invention, the resin constituting the gate insulating layer has a benzene ring and has affinity for an organic semiconductor compound. Therefore, a uniform flat interface is formed between an organic semiconductor layer and a gate insulating layer by the above-mentioned application and drying method.

The solvent to be used in the organic semiconductor application solution is not particularly limited as long as it can dissolve or disperse organic semiconductors, and it is preferably a solvent having a boiling point of from 50° C. to 200° C. under ambient pressure. Examples of the solvent include chloroform, toluene, anisole, 2-heptanone and propylene glycol monomethyl ether acetate. As with the above-mentioned insulating layer application solution, the organic semiconductor application solution can be applied onto the gate insulating layer by a publicly known method, such as spin coating, die coating, screen printing, or inkjet.

The gate insulating layer 3 and the overcoat layer 7 can be formed by the same method as the above-mentioned method of forming an insulating layer of an electronic device.

On the gate insulating layer may be formed a self-assembled monomolecular film layer. The self-assembled monomolecular film layer can be formed by, for example, treating the gate insulating layer with a solution in which from 1 to 10% by weight of an alkylchlorosilane compound or an alkylalkoxysilane compound has been dissolved in an organic solvent.

Examples of the alkylchlorosilane compound include methyltrichlorosilane, ethyltrichlorosilane, butyltrichlorosilane, decyltrichlorosilane and octadecyltrichlorosilane.

Examples of the alkylalkoxysilane compound include methyltrimethoxysilane, ethyltrimethoxysilane, butyltrimethoxysilane, decyltrimethoxysilane and octadecyltrimethoxysilane.

The organic thin film transistor of the present invention may be coated with an overcoat material for the purpose of protecting the organic thin film transistor and improving the smoothness of its surface.

An insulating layer produced by using the electronic device insulating layer material of the present invention can have a smooth film or the like laminated thereon and can easily form a laminated structure. Moreover, an organic electroluminescence device can be suitably mounted on the insulating layer.

By the use of the electronic device insulating layer material of the present invention, a member for displays having an organic thin film transistor can be favorably produced. By the use of the member for displays having an organic thin film transistor, a display having a member for displays can be produced.

The electronic device insulating layer material of the present invention can also be used for applications for forming a layer contained in a transistor other than an insulating layer and a layer contained in an organic electroluminescence device.

EXAMPLES

Hereinafter, the present invention will be described by way of examples, but needless to say, the present invention is not intended to be limited to these examples.

Synthesis Example 1

Synthesis of Polymer Compound 1

In a 50 ml pressure-resistant container (manufactured by ACE GLASS Inc.), 2.25 g of 4-(1-ethoxyethoxyl)styrene (produced by TOSOH ORGANIC CHEMICAL CO., LTD.), 2.50 g of glycidyl methacrylate (produced by Wako Pure Chemical Industries, Ltd.), 2.81 g of 2-(O-[1'-methylpropylideneamino]carboxyamino)ethyl-methacrylate (produced by Showa Denko K.K., trade name "Karenz MOI-BM"), 0.62 g of acrylonitrile (produced by Wako Pure Chemical Industries, Ltd.), 0.79 g of 4-vinylanisole (produced by Wako Pure Chemical Industries, Ltd.), 0.04 g of 2,2'-azobis(2-methylpropionitrile) and 21.04 g of 2-heptanone (produced by Tokyo Chemical Industry Co., Ltd.) were put, the resulting mixture was bubbled with an argon gas, and then the container was sealed. Polymerization was carried out in an oil bath at 60° C. for 20 hours to obtain a viscous 2-heptanone solution containing a polymer compound 1 dissolved therein. The polymer compound 1 has the following repeating unit. A suffix to a parenthesis indicates mole fraction of a repeating unit.

[Chemical Formula 7]

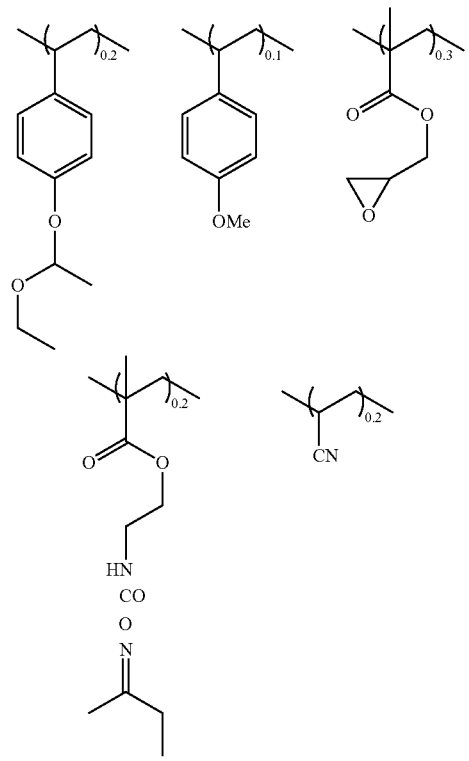

Polymer Compound 1

The weight average molecular weight of the resulting polymer compound 1 calculated from reference polystyrene was 114000 (GPC manufactured by SHIMADZU CORPORATION, one Tskgel super HM-H and one Tskgel super H2000, mobile phase=THF).

Synthesis Example 2

Synthesis of Polymer Compound 2

To 80 ml of toluene containing 1.88 g of 2,1,3-benzothiadiazole-4,7-di(ethylene boronate) and 3.81 g of 2,6-dibromo-(4,4-bis-hexadecanyl-4H-cyclopenta[2,1-b;3,4-b']-dithiophene), 0.75 g of tetrakis(triphenyl phosphine) palladium, 1.0 g of methyltrioctylammonium chloride (produced by Aldrich Chemical Company, Inc., trade name "Aliquat 336" (registered trademark)) and 24 ml of a 2 M aqueous sodium carbonate solution were added under a nitrogen atmosphere. The resulting mixture was stirred vigorously and heated to reflux for 24 hours. The resulting viscous reaction mixture was poured into 500 ml of acetone to precipitate a fibrous yellow polymer. This polymer was collected by filtration, washed with acetone, and dried at 60° C. in a vacuum oven overnight. The resulting polymer is referred to as a polymer compound 2. The polymer compound 2 has the following repeating unit. n represents the number of repeating units.

[Chemical Formula 8]

Polymer Compound 2

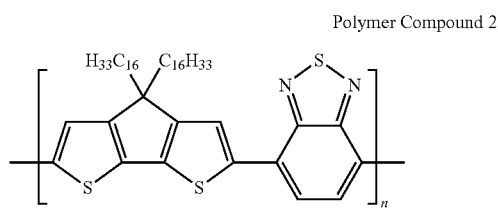

The weight average molecular weight of the polymer compound 2 calculated from reference polystyrene was 32000 (GPC manufactured by SHIMADZU CORPORATION, one Tskgel super HM-H and one Tskgel super H2000, mobile phase=THF).

Example 1

Preparation of Organic Thin Film Transistor Insulating Layer Material and Measurement of Solvent Resistance of Organic Thin Film Transistor Insulating Layer In a 10 ml sample bottle, 1.00 g of a 2-heptanone solution of the polymer compound 1 obtained in Synthesis Example 1, 0.05 g of tungsten (V) ethoxide (produced by Gelest Inc.), 0.04 g of acetylacetone (produced by Wako Pure Chemical Industries, Ltd.), and 1.00 g of propylene glycol monomethyl ether acetate (produced by Tokyo Chemical Industry Co., Ltd.) were put, and the tungsten (V) ethoxide was dissolved while stirring the resulting mixture to prepare a uniform application solution 1 serving as an organic thin film transistor insulating layer material.

The resulting application solution 1 was filtered with a membrane filter having a pore diameter of 0.2 applied onto a silicon wafer by spin coating, and then dried on a hot plate at 100° C. for 1 minute in the atmospheric air. Thereafter, the dried application solution 1 was baked on a hot plate at 120° C. for 30 minutes to obtain an organic thin film transistor insulating layer.

The obtained organic thin film transistor insulating layer was dipped in propylene glycol monomethyl ether acetate for 1 minute and the film thinning of the insulating layer was determined by measuring the thickness before and after dipping. The result is shown in Table 1. The case where there was no film thinning is denoted by a and the case where there was film thinning is denoted by x.

Example 2

Production of Electric Field Effect Type Organic Thin Film Transistor and Evaluation of Transistor Characteristics The resulting application solution 1 was filtered with a membrane filter having a pore diameter of 0.2 μm, applied onto a glass substrate with a chromium electrode by spin coating, and then dried on a hot plate at 100° C. for 1 minute in the atmospheric air. Thereafter, the dried application solution 1 was baked on a hot plate at 120° C. for 30 minutes to obtain a gate insulating layer.

Then, the polymer compound 2 was dissolved in xylene as a solvent to prepare a solution (organic semiconductor composition) having a concentration of 0.5% by weight, and the solution was filtered through a membrane filter to prepare an application solution.

The resulting application solution was applied onto the gate insulating layer by a spin coating method to form an active layer having a thickness of about 30 nm, and subsequently a source electrode and a drain electrode, each having a channel length of 20 μm and a channel width of 2 mm, were formed on the active layer by depositing molybdenum oxide and gold on the active layer by a vacuum deposition method using a metal mask, and thereby an electric field effect type organic thin film transistor was produced. Each of the source electrode and the drain electrode has a laminated structure in the order of molybdenum oxide and gold from the active layer side.

With respect to the thus-produced electric field effect type organic thin film transistors, the transistor characteristics thereof were measured by using a vacuum prober (BCT22MDC-5-HT-SCU; manufactured by Nagase Electronic Equipments Service Co., Ltd.) under conditions such that a gate voltage Vg was varied from 20 to −40 V and a source-drain voltage Vsd was varied from 0 to −40 V. The results are shown in Table 2.

The hysteresis of the electric field effect type organic thin film transistor was expressed by a voltage difference between a threshold voltage Vth1 measured when the gate voltage Vg was varied from 20 V to −40 V at a source-drain voltage Vsd of −40 V and a threshold voltage Vth2 measured when the gate voltage Vg was varied from −40 V to 20 V.

Comparative Example 1

Preparation of Organic Thin Film Transistor Insulating Layer Material and Measurement of Solvent Resistance of Organic Thin Film Transistor Insulating Layer An organic thin film transistor insulating layer material was prepared in the same manner as in Example 1 except that tungsten (V) ethoxide was not added, and the solvent resistance of the organic thin film transistor insulating layer was measured. The result is shown in Table 1. The organic thin film transistor insulating layer was completely dissolved in propylene glycol monomethyl ether acetate. When the organic thin film transistor insulating layer material was heated at 120° C., a gate insulating layer having high solvent resistance was not formed.

TABLE 1

|  | Film Thinning |
|---|---|
| Example 1 | ○ |
| Comparative Example 1 | x |

TABLE 2

| | Hysteresis | Vth |
|---|---|---|
| Example 2 | 1.1 V | 8.2 V |

DESCRIPTION OF REFERENCE SIGNS

1 Substrate
2 Gate electrode
3 Gate insulating layer
4 Organic semiconductor layer
5 Source electrode
6 Drain electrodes
7 Overcoat

The invention claimed is:

1. An electronic device insulating layer material comprising:
a polymer compound (A) which contains a repeating unit containing a cyclic ether structure and a repeating unit represented by the formula (1):

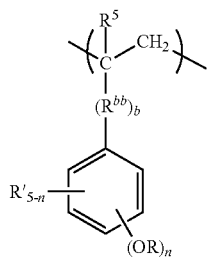
(1)

wherein $R^5$ represents a hydrogen atom or a methyl group; $R^{bb}$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms and optionally having a fluorine atom; the suffix b represents an integer of 0 or 1, and the suffix n represents an integer of from 1 to 5; when there are two or more Rs, they may be the same or different; and when there are two or more R's, they may be the same or different; and
tungsten (V) alkoxide (B).

2. The electronic device insulating layer material according to claim 1, wherein the repeating unit having a cyclic ether structure is at least one repeating unit selected from the group consisting of a repeating unit represented by the formula (2):

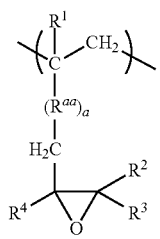
(2)

wherein $R^1$ represents a hydrogen atom or a methyl group; $R^2$, $R^3$ and $R^4$ each independently represent a hydrogen atom or a monovalent organic group having from 1 to 20 carbon atoms and optionally having a fluorine atom; $R^{aa}$ represents a linking moiety which links the main chain of the polymer compound with a side chain of the polymer compound, and optionally has a fluorine atom; and the suffix a represents an integer of 0 or 1, and a repeating unit represented by the formula (3):

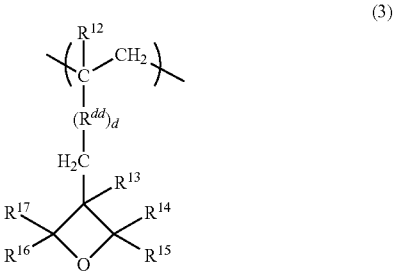
(3)

wherein $R^{12}$ represents a hydrogen atom or a methyl group; $R^{13}$, $R^{14}$, $R^{15}$, $R^{16}$ and $R^{17}$ each independently represent a hydrogen atom or a monovalent organic group having from 1 to 20 carbon atoms and optionally having a fluorine atom; $R^{dd}$ represents a linking moiety which links the main chain of the polymer compound with a side chain of the polymer compound, and optionally has a fluorine atom; and the suffix d represents an integer of 0 or 1.

3. The electronic device insulating layer material according to claim 1, wherein the polymer compound (A) is a polymer compound further containing a repeating unit containing the following first functional group:
first functional group: a functional group capable of affording, by the action of electromagnetic waves or heat, a second functional group capable of reacting with active hydrogen.

4. The electronic device insulating layer material according to claim 3, wherein the first functional group is at least one group selected from the group consisting of an isocyanato group blocked with a blocking agent and an isothiocyanato group blocked with a blocking agent.

5. The electronic device insulating layer material according to claim 4, wherein the isocyanato group blocked with a blocking agent and the isothiocyanato group blocked with a blocking agent are groups represented by the formula (5):

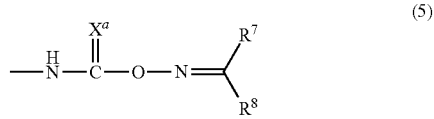
(5)

wherein $X^a$ represents an oxygen atom or a sulfur atom, and $R^7$ and $R^8$ each independently represent a hydrogen atom or a monovalent organic group having from 1 to 20 carbon atoms.

6. The electronic device insulating layer material according to claim 4, wherein the isocyanato group blocked with a blocking agent and the isothiocyanato group blocked with a blocking agent are groups represented by the formula (6):

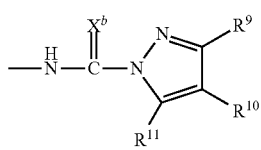

wherein $X^b$ represents an oxygen atom or a sulfur atom, and $R^9$, $R^{10}$ and $R^{11}$ each independently represent a hydrogen atom or a monovalent organic group having from 1 to 20 carbon atoms.

7. The electronic device insulating layer material according to claim 1, wherein the polymer compound (A) is a polymer compound further containing a repeating unit represented by the formula (4):

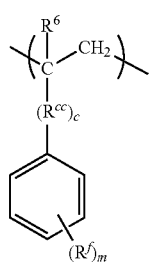

wherein $R^6$ represents a hydrogen atom or a methyl group; $R^f$ represents a fluorine atom or a monovalent organic group having from 1 to 20 carbon atoms and optionally having a fluorine atom; $R^{cc}$ represents a linking moiety which links the main chain of the polymer compound with a side chain of the polymer compound, and optionally has a fluorine atom; the suffix c represents an integer of 0 or 1, and the suffix m represents an integer of from 1 to 5; and when there are two or more $R^f$s, they may be the same or different, provided that at least one $R^f$ is a fluorine atom or a monovalent organic group having from 1 to 20 carbon atoms and having a fluorine atom.

8. The electronic device insulating layer material according to claim 1, which is an organic thin film transistor insulating layer material.

9. A method for forming an electronic device insulating layer comprising the steps of:
applying a solution containing an electronic device insulating layer material comprising:
a polymer compound (A) which contains a repeating unit containing a cyclic ether structure and a repeating unit represented by the formula (1):

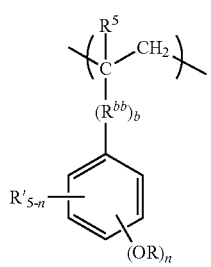

wherein $R^5$ represents a hydrogen atom or a methyl group; $R^{bb}$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms and optionally having a fluorine atom; the suffix b represents an integer of 0 or 1, and the suffix n represents an integer of from 1 to 5; when there are two or more Rs, they may be the same or different; and when there are two or more R's, they may be the same or different; and tungsten (V) alkoxide (B), onto a substrate material to form an applied layer on the substrate material; and applying heat to the applied layer.

10. An electronic device having an electronic device insulating layer formed by using an electronic device insulating layer material comprising:
a polymer compound (A) which contains a repeating unit containing a cyclic ether structure and a repeating unit represented by the formula (1):

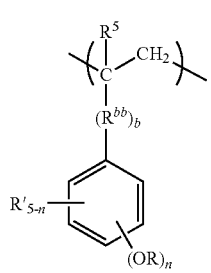

wherein $R^5$ represents a hydrogen atom or a methyl group; $R^{bb}$ represents a linking moiety which links the main chain of the polymer compound with a side chain of the polymer compound and optionally has a fluorine atom; R represents an organic group capable of being detached by an acid; R' represents a hydrogen atom or a monovalent organic group having from 1 to 20 carbon atoms and optionally having a fluorine atom; the suffix b represents an integer of 0 or 1 and the suffix n represents an integer of from 1 to 5; when there are two or more Rs they may be the same or different; and when there are two or more R's, they may be the same or different; and tungsten (V) alkoxide (B).

11. The electronic device according to claim 10, wherein the electronic device insulating layer is an organic thin film transistor gate insulating layer.

12. A member for a display, the member comprising the electronic device according to claim 10.

13. A display comprising the member for a display according to claim 12.

* * * * *